(12) United States Patent
Mouli

(10) Patent No.: US 8,871,574 B2
(45) Date of Patent: Oct. 28, 2014

(54) MEMORY CELLS, MEMORY CELL CONSTRUCTIONS, AND MEMORY CELL PROGRAMMING METHODS

(71) Applicant: Micron Technology, Inc., Boise, ID (US)

(72) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/959,511

(22) Filed: Aug. 5, 2013

(65) Prior Publication Data

US 2013/0322158 A1 Dec. 5, 2013

Related U.S. Application Data

(60) Continuation of application No. 13/091,000, filed on Apr. 20, 2011, now Pat. No. 8,502,291, which is a division of application No. 12/125,756, filed on May 22, 2008, now Pat. No. 8,134,194.

(51) Int. Cl.

| | | |
|---|---|---|
| H01L 21/20 | (2006.01) | |
| H01L 45/00 | (2006.01) | |
| G11C 13/00 | (2006.01) | |
| G11C 11/02 | (2006.01) | |
| H01L 27/102 | (2006.01) | |
| H01L 27/10 | (2006.01) | |
| H01L 27/24 | (2006.01) | |

(52) U.S. Cl.
CPC .......... *H01L 45/145* (2013.01); *H01L 45/1233* (2013.01); *H01L 45/08* (2013.01); *G11C 13/0002* (2013.01); *G11C 11/02* (2013.01); *H01L 45/085* (2013.01); *H01L 27/1021* (2013.01); *H01L 27/101* (2013.01); *H01L 27/2418* (2013.01); *H01L 45/146* (2013.01); *G11C 2213/72* (2013.01); *G11C 13/003* (2013.01)
USPC .................. 438/141; 438/3; 438/95; 438/381; 257/296; 257/295; 257/E21.006; 257/E21.021; 257/E21.053; 257/E21.32; 257/E21.208; 257/E21.209; 257/E21.253; 257/E21.267; 257/E21.352; 257/E21.645; 257/E21.657; 257/E21.659; 257/E21.664

(58) Field of Classification Search
USPC ........ 438/3, 95, 141, 297, 381; 257/296, 295, 257/68, E21.006, E21.021, E21.053, 257/E21.32, E21.208, E21.209, E21.253, 257/E21, 267, E21.352, E21.645, E21.657, 257/E21.659, E21.664
See application file for complete search history.

(56) References Cited

U.S. PATENT DOCUMENTS

| 3,972,059 A | 7/1976 | Distefano |
|---|---|---|
| 4,068,217 A | 1/1978 | Arnett et al. |

(Continued)

FOREIGN PATENT DOCUMENTS

| EP | 0 660 412 | 12/1994 |
|---|---|---|
| EP | 1 265 287 | 12/2002 |

(Continued)

OTHER PUBLICATIONS

WO PCT/US08/059661 IPRP, Nov. 3, 2009, Micron Technology, Inc.

(Continued)

*Primary Examiner* — David Nhu
(74) *Attorney, Agent, or Firm* — Wells St. John P.S.

(57) ABSTRACT

Some embodiments include memory cells including a memory component having a first conductive material, a second conductive material, and an oxide material between the first conductive material and the second conductive material. A resistance of the memory component is configurable via a current conducted from the first conductive material through the oxide material to the second conductive material. Other embodiments include a diode comprising metal and a dielectric material and a memory component connected in series with the diode. The memory component includes a magnetoresistive material and has a resistance that is changeable via a current conducted through the diode and the magnetoresistive material.

21 Claims, 4 Drawing Sheets

(56) References Cited

U.S. PATENT DOCUMENTS

| | | |
|---|---|---|
| 5,497,017 A | 3/1996 | Gonzales |
| 5,512,773 A | 4/1996 | Wolf et al. |
| 6,356,477 B1 | 3/2002 | Tran |
| 6,534,784 B2 | 3/2003 | Eliasson et al. |
| 6,677,207 B1 | 1/2004 | Malone |
| 6,753,561 B1 | 6/2004 | Rinerson et al. |
| 6,756,649 B2 | 6/2004 | Moddel et al. |
| 6,778,421 B2 | 8/2004 | Tran |
| 6,826,079 B2 | 11/2004 | Tran |
| 6,944,052 B2 | 9/2005 | Subramanian et al. |
| 6,961,258 B2 | 11/2005 | Lowrey |
| 6,965,129 B1 | 11/2005 | Horch et al. |
| 6,965,137 B2 | 11/2005 | Kinney et al. |
| 7,035,141 B1 | 4/2006 | Tripsas et al. |
| 7,042,035 B2 | 5/2006 | Rinerson et al. |
| 7,067,862 B2 | 6/2006 | Rinerson et al. |
| 7,071,008 B2 | 7/2006 | Rinerson et al. |
| 7,145,790 B2 | 12/2006 | Kang |
| 7,180,770 B2 | 2/2007 | Perner et al. |
| 7,193,267 B2 | 3/2007 | Hsu et al. |
| 7,220,983 B2 | 5/2007 | Lung |
| 7,320,895 B1 | 1/2008 | Horch et al. |
| 7,388,276 B2 | 6/2008 | Estes |
| 7,400,006 B1 | 7/2008 | Rinerson et al. |
| 7,408,212 B1 | 8/2008 | Luan et al. |
| 7,525,832 B2 | 4/2009 | Muraoka et al. |
| 7,577,022 B2 | 8/2009 | Muraoka et al. |
| 7,706,167 B2 | 4/2010 | Toda et al. |
| 7,719,875 B2 | 5/2010 | Toda et al. |
| 7,755,934 B2 | 7/2010 | Toda et al. |
| 7,858,506 B2 | 12/2010 | Sandhu et al. |
| 7,859,885 B2 | 12/2010 | Toda |
| 8,102,699 B2 | 1/2012 | Toda |
| 8,120,951 B2 | 2/2012 | Mouli |
| 8,134,194 B2 | 3/2012 | Mouli |
| 8,294,219 B2 | 10/2012 | Malhotra et al. |
| 8,502,291 B2 * | 8/2013 | Mouli .......................... 257/296 |
| 2002/0089024 A1 | 7/2002 | Iwata |
| 2002/0196659 A1 | 12/2002 | Hurst et al. |
| 2003/0189851 A1 | 10/2003 | Brandenberger et al. |
| 2003/0203585 A1 | 10/2003 | Hsu |
| 2004/0100817 A1 | 5/2004 | Subramanian et al. |
| 2004/0159828 A1 | 8/2004 | Rinerson et al. |
| 2004/0159867 A1 | 8/2004 | Kinney et al. |
| 2004/0159868 A1 | 8/2004 | Rinerson et al. |
| 2004/0159869 A1 | 8/2004 | Rinerson et al. |
| 2004/0161888 A1 | 8/2004 | Rinerson et al. |
| 2005/0112846 A1 | 5/2005 | Meyer et al. |
| 2005/0128798 A1 | 6/2005 | Kang |
| 2005/0158950 A1 | 7/2005 | Scheuerlein et al. |
| 2005/0207248 A1 | 9/2005 | Hsu |
| 2005/0275106 A1 | 12/2005 | Fricke et al. |
| 2006/0050581 A1 | 3/2006 | Luk et al. |
| 2006/0203541 A1 | 9/2006 | Toda |
| 2006/0249753 A1 | 11/2006 | Herner et al. |
| 2007/0015348 A1 | 1/2007 | Hsu et al. |
| 2007/0069276 A1 | 3/2007 | Scheuerlein et al. |
| 2007/0070690 A1 | 3/2007 | Scheuerlein et al. |
| 2007/0090425 A1 | 4/2007 | Kumar et al. |
| 2007/0221953 A1 | 9/2007 | Sakamoto |
| 2007/0240995 A1 | 10/2007 | Odagawa et al. |
| 2007/0267667 A1 | 11/2007 | Ufert |
| 2007/0285969 A1 | 12/2007 | Toda |
| 2007/0285970 A1 | 12/2007 | Toda |
| 2007/0285971 A1 | 12/2007 | Toda |
| 2008/0112211 A1 | 5/2008 | Toda |
| 2008/0212359 A1 | 9/2008 | Muraoka et al. |
| 2008/0272363 A1 | 11/2008 | Mouli |
| 2008/0273363 A1 | 11/2008 | Mouli |
| 2009/0067215 A1 | 3/2009 | Muraoka et al. |
| 2011/0080778 A1 | 4/2011 | Toda |
| 2012/0099370 A1 | 4/2012 | Toda |

FOREIGN PATENT DOCUMENTS

| | | |
|---|---|---|
| EP | 09751113 | 5/2011 |
| GB | 2 409 336 | 6/2005 |
| KR | 20050058930 | 6/2005 |
| KR | 20050110680 | 11/2005 |
| KR | 20080005443 | 1/2008 |
| KR | 1020107026077 | 6/2012 |
| WO | WO 2004/084228 | 9/2004 |
| WO | WO 2006/055482 | 5/2006 |
| WO | WO 2006/114904 | 11/2006 |
| WO | WO 2008/134205 | 11/2008 |

OTHER PUBLICATIONS

WO PCT/US08/059661 Search Rep., Jul. 13, 2008, Micron Technology, Inc.
WO PCT/US08/059661 Written Op., Jul. 13, 2008, Micron Technology, Inc.
WO PCT/US09/035006 IPRP, Aug. 31, 2010, Micron Technology, Inc.
WO PCT/US09/035006 Search Rep., Jun. 26, 2009, Micron Technology, Inc.
WO PCT/US09/035006 Written Op., Jun. 26, 2009, Micron Technology, Inc.
WO PCT/US09/042168 IPRP, Nov. 23, 2010, Micron Technology, Inc.
WO PCT/US09/042168 Search Rep., Sep. 30, 2009, Micron Technology, Inc.
WO PCT/US09/042168 Written Op., Sep. 30, 2009, Micron Technology, Inc.
WO PCT/US09/042236 IPRP, Nov. 23, 2010, Micron Technology, Inc.
WO PCT/US09/042236 Search Rep., Dec. 15, 2009, Micron Technology, Inc.
WO PCT/US09/042236 Written Op., Dec. 18, 2009, Micron Technology, Inc.
TW 098115926 Search Report, Jun. 20, 2013, Micron Technology, Inc.
TW 098115926 SR Translation, Sep. 27, 2012, Micron Technology, Inc.
TW 200980118151.4 Search Rep., May 28, 2013, Micron Technology, Inc.
Daughton, "Magnetoresistive Random Access Memory (MRAM)" © Feb. 4, 2000, 13 pages.
Feng, "Evaluation of SiO2 Antifuse in a 3D-OTP Memory" Sep. 3, 2004, IEEE Transactions on Device and Materials Reliability, vol. 4, pp. 419-421.
Hobbs et al., "Fermi-Level Pinning at the Polysilicon/Metal Oxide Interface-Part I" Jun. 6, 2004, IEEE Transactions on Electron Devices, vol. 51, pp. 971-977.
Hu et al., "Atomic Layer Deposition of TiO2 from TiI4 and H2O onto SiO2 Surfaces: Ab Initio Calculations of the Initial Reaction Mechanisms", Journal of the American Chemical Society, vol. 129, No. 13, pp. 3863-3878 (Apr. 4, 2007).
Lee et al., "Two Series Oxide Resistors Applicable to High Speed and High Density Nonvolatile Memory"; Advanced Materials, vol. 19, No. 22, 2007, pp. 3919-3923.
Table of Melting Temperatures of Metals, retrieved online at www.engineeringtoolbox.com (Mar. 19, 2012).
EP 08 783 169.0 Search Report, Apr. 6, 2010, Micron Technology, Inc.
EP 09 75 1110 Sup. Search Rept, Jun. 21, 2012, Micron Technology, Inc.
TW 097114674 Search Rept Trans, Aug. 26, 2011, Micron Technology, Inc.
TW 098106558 Search Rept Trans, Mar. 1, 2013, Micron Technology, Inc.
TW 098115904 Search Rept Trans, Feb. 20, 2013, Micron Technology, Inc.
Asamitsu et al., "Current Switching of Resistive States in Magnetoresistive Manganites", Letters to Nature vol. 388, No. 6637, Jul. 3, 1997, United Kingdom, pp. 50-52.

* cited by examiner

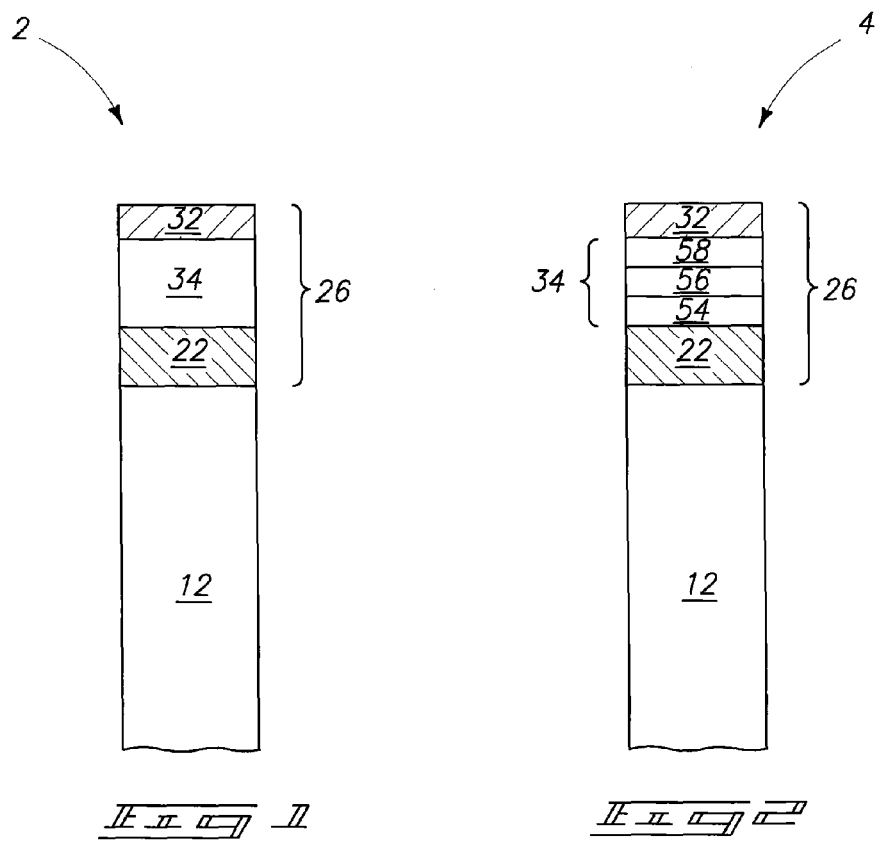
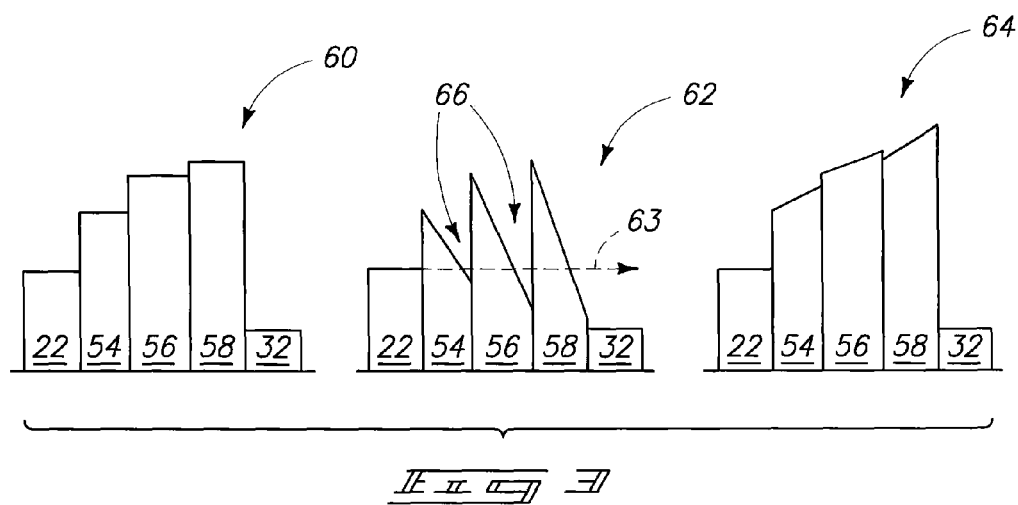

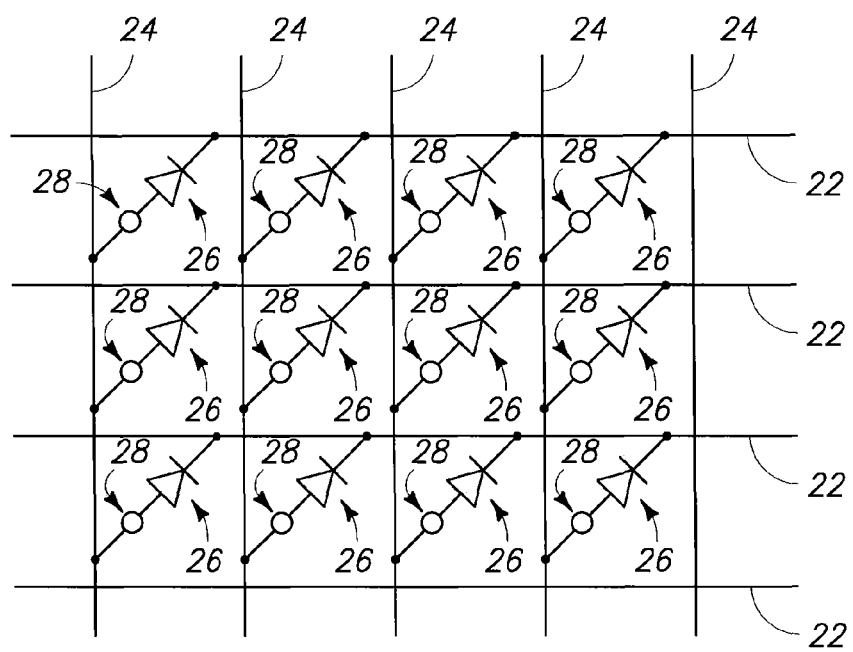

MEMORY CELLS, MEMORY CELL CONSTRUCTIONS, AND MEMORY CELL PROGRAMMING METHODS

RELATED PATENT DATA

This application is a continuation of and claims priority to U.S. patent application Ser. No. 13/091,000, filed on Apr. 20, 2011, which issued as U.S. Pat. No. 8,502,291 on Aug. 6, 2013, which is a divisional of and claims priority to U.S. patent application Ser. No. 12/125,756, filed on May 22, 2008, which issued as U.S. Pat. No. 8,134,194 on Mar. 13, 2012, the disclosures of which are incorporated herein by reference.

TECHNICAL FIELD

Memory cells, memory cell constructions, and memory cell programming methods.

BACKGROUND

Non-volatile memory is widely used in portable devices such as digital cameras and personal audio players. Many different types of non-volatile memory are available, each using a different fundamental technology. Flash memory and magnetic disk memory are two examples of non-volatile memory. Some non-volatile memory may be bulky and may consume an undesirable amount of power. It is desired to extend the battery life of portable devices that use non-volatile memory and to reduce the size of such devices. Accordingly, non-volatile memory that occupies a small area and consumes a small amount of power is desirable.

BRIEF DESCRIPTION OF THE DRAWINGS

FIG. 1 is diagrammatic cross-sectional view of a portion of a construction in accordance with an embodiment.

FIG. 2 is diagrammatic cross-sectional view of a portion of a construction in accordance with an embodiment.

FIG. 3 shows three band-gap diagrams illustrating three different bias conditions of a diode in accordance with an embodiment.

FIG. 4 is a schematic electrical diagram of an array of memory elements in accordance with an embodiment.

FIG. 5 also shows a schematic electrical diagram of some of the components of the cross-section.

FIG. 6 also shows a schematic electrical diagram of some of the components of the cross-section.

DETAILED DESCRIPTION OF THE ILLUSTRATED EMBODIMENTS

Figure 5:
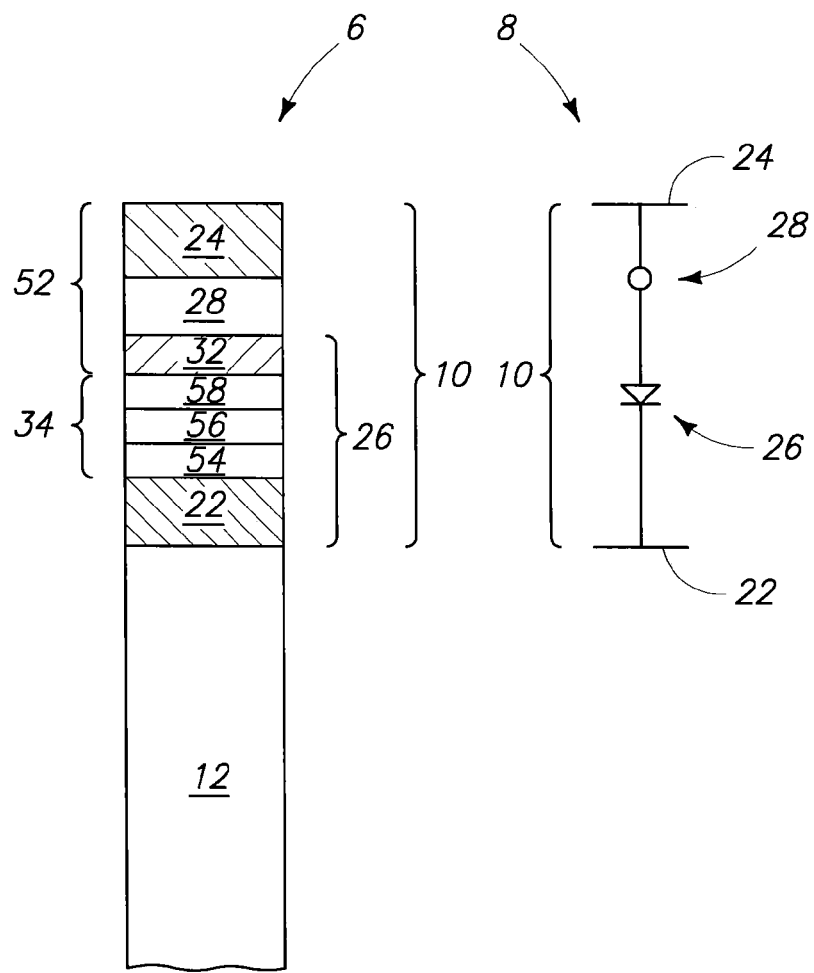
FIG. 5 is diagrammatic cross-sectional view of a portion of a semiconductor construction in accordance with an embodiment.

In some embodiments, cross-point memory cells are formed to include diodes. The diodes may be configured to enable current to pass to or from a portion of the memory cell, while also alleviating, and possibly preventing, cross-talk between adjacent devices. The diodes may contain stacked thin dielectric films, with the dielectric films being band-structure engineered to achieve tailored diode properties for particular memory cells.

It may be advantageous to utilize stacked dielectric materials for the diodes rather than utilizing conventional silicon-based n-p junction diodes. The conventional silicon-based junction diodes may be limited relative to bandgap, Shockley-Read-Hall (SRH) generation and recombination rates, active doping concentrations, injection velocity, carrier lifetime, and breakdown strength (or other high field properties such as ionization rates, etc.).

The cross-point memory cells may be arranged in vertical stacks. Stacking of the memory cells may substantially reduce the real estate consumption attributed to individual memory cells. For instance, if two $4F^2$ memory cells are stacked such that one is directly over the other, then the amount of semiconductor real estate consumed by each is effectively cut in half so that the individual memory cells are essentially only consuming $2F^2$ of semiconductor real estate. The reduction in effective real estate consumption increases proportionally to the number of vertically-stacked memory cells. Thus, significant strides in integration may be achieved by vertically stacking at least some of the memory cells of a memory cell array.

The stacked memory cells may be utilized as nonvolatile memory, and may correspond to single level cells (SLCs) or multilevel cells (MLCs). Such nonvolatile memory may be incorporated into NAND memory arrays. In embodiments in which multi-stacked multilevel cells (MS-MLCs) are formed, the memory may prove to be particularly low-cost, high-performance, and high-density. The stacked cells may be routed through multi-level interconnects.

In some embodiments, the fabrication of memory cells is conducted over a silicon substrate utilizing low-temperature deposition processes, and with few if any high temperature dopant activation steps. Avoidance of high-temperature processing may alleviate thermally-induced damage to integrated circuit devices. Also, many of the materials showing promise for utilization as memory elements in cross-point memory cells (for instance, $Ge_2Se_2Te_5$ and other chalcogenides, various metal oxides, etc.) lack high-temperature stability.

Example embodiments are described with reference to FIGS. 1-14.

Referring to FIG. 1, a fragment of a diode construction 2 is illustrated. The fragment comprises a base 12 and a diode 26 over base 12.

Base 12 may comprise semiconductor material, and in some embodiments may comprise, consist essentially of, or consist of monocrystalline silicon. The base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, it may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc. In some embodiments, an uppermost region of the base may comprise an electrically insulative material so that a conductive layer of diode 26 is directly against such insulative material. In some embodiments, base 12 may comprise a semiconductor-on-insulator (SOI) construction.

Diode 26 comprises conductive materials 22 and 32 and insulative material 34. In some embodiments, conductive materials 22 and 32 may be referred to as conductive diode materials (or in other words, as diode electrodes). Conductive materials 22 and 32 may comprise any suitable composition or combination of compositions, and may, for example, comprise, consist essentially of, or consist of one or more of various metals (for instance, tantalum, platinum, tungsten, aluminum, copper, gold, nickel, titanium, molybdenum, etc.), metal-containing compositions (for instance, metal nitrides, metal silicides such as tungsten silicate or tantalum silicide, etc.), and conductively-doped semiconductor materials (for instance, conductively-doped silicon). In some embodiments, conductive materials 22 and 32 may each have a thickness of from about 2 nanometers to about 20 nanometers.

In some embodiments, material 22 may include one of aluminum, tungsten, molybdenum, platinum, nickel, tantalum, copper, titanium, tungsten silicide, or tantalum silicide and material 32 may include a different one of aluminum, tungsten, molybdenum, platinum, nickel, tantalum, copper, titanium, tungsten silicide, or tantalum silicide.

Insulative material 34 may be referred to as diode dielectric material, and may comprise any suitable composition or combination of compositions. As illustrated by FIG. 1, insulative material 34 may be in direct physical contact with both material 22 and material 34.

In some embodiments, insulative material 34 comprises a stack of electrically insulative layers, with the individual layers having band gap and/or band-alignment properties tailored for the particular application of the diode. The layers may have individual thicknesses of from about 0.7 nanometers to about 5 nanometers and may comprise, consist essentially of, or consist of one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide. The oxide and nitrides are referred to in terms of the principal components, rather than in terms of specific stoichiometries. Accordingly, the oxide of silicon is referred to as silicon oxide, which encompasses the stoichiometry of silicon dioxide.

Diode 26 may be configured to conduct current from material 32 to material 22 when a first voltage is applied across material 32 and material 22 with material 32 being at a higher potential than material 22. Diode 26 may also be configured to inhibit current from flowing from material 22 to material 34 when a second voltage is applied across material 32 and material 22 with material 22 being at a higher potential than material 32. Accordingly, the second voltage may have a polarity opposite that of a polarity of the first voltage. In some embodiments, the first voltage may be between about 0.5 volts and 1.5 volts and the second voltage may be between about 0 volts and −15 volts. Accordingly, diode 26 may be characterized as a selectively conducting device whose ability to conduct current depends on an applied bias voltage.

In some embodiments, the first voltage may have the same magnitude as the second voltage. Accordingly, diode 26 may allow current to flow from material 32 to material 22 when forward biased with a voltage but may inhibit current from flowing from material 22 to material 32 when reverse biased with the same voltage.

Tunneling properties of material 34, and/or carrier injection properties of conductive materials 22 and 32, may be tailored to engineer desired properties into diode 26. For example, materials 22, 32, and 34 may be engineered so that diode 26 allows electrons to tunnel from material 22 through material 34 to material 32 when the first voltage described above is applied across material 32 and material 22 but inhibits electrons from tunneling from material 32 to material 22 when the second voltage described above is applied across material 32 and material 22.

Referring to FIG. 2, a fragment of a diode construction 4 is illustrated. Similar numbering is used in referring to FIG. 2 as is used above in describing FIG. 1 where appropriate. Fragment 4 depicts another embodiment of diode 26. Fragment 4 includes base 12 and diode 26 over base 12.

In the shown embodiment, diode dielectric material 34 comprises a stack of three different dielectric compositions 54, 56, and 58. Such compositions may be tailored relative to one another so that band gaps, and/or conduction band edges, and/or valence band edges, between the compositions enable tunneling of carriers in one direction through the compositions, but not in an opposing direction.

Dielectric compositions 54, 56, and 58 may comprise any suitable compositions, and may, for example, comprise one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide.

Although example diode 26 of FIG. 2 has three different dielectric compositions (54, 56, and 58), in other embodiments diode 26 may comprise other than three different dielectric compositions. Specifically, in some embodiments diode 26 may comprise more than three different dielectric compositions, and in other embodiments diode 26 may comprise less than three different dielectric compositions. The number of different dielectric compositions used in diode 26 may affect the speed with which the diode reacts to a voltage. For example, as the number of different dielectric compositions increases, a difference between a time when diode 26 is biased with a voltage and a time when current begins to flow through diode 26 responsive to the voltage may decrease. However, as the number of different dielectric compositions increases, a magnitude of a voltage used to forward bias diode 26 may also increase.

The embodiment of FIG. 2 may be fabricated as follows. Initially, material 22 may be formed over base 12. Material 22 may be patterned by utilizing photolithographic processing and one or more etches. Subsequently, composition 54 may be formed over material 22. In some embodiments, composition 54 may be deposited on material 22 and may be patterned using photolithographic processing and one or more etches. Composition 54 may be deposited with any suitable methodology, including, for example, atomic layer deposition (ALD). Compositions 56 and 58 may subsequently be deposited over composition 54 using one or more of the techniques described above in relation to composition 54.

In some embodiments, the methods used in forming composition 54, 56, and 58 may be selected so that the methods do not substantially change the dimensions of material 22 or otherwise render material 22 inoperable as an electrode of diode 26. For example, a maximum temperature used in forming composition 54, 56, and 58 may be below a melting temperature of material 22 so that material 22 does not change dimension or shape as a result of the formation of compositions 54, 56, and 58. By way of another example, compositions 54, 56, and 58 may be undoped. Accordingly, annealing might not be used in forming compositions 54, 56, and 58. Forming these compositions without annealing may be advantageous because annealing may involve undesirably altering dimensions of material 22 as a result of high temperatures used during annealing.

Subsequently, material 32 may be formed over composition 58. Material 32 may be patterned by utilizing photolithographic processing and one or more etches. Material 32 may be undoped and the formation of material 32 might not use a temperature higher than a melting temperature of material 22.

FIG. 3 shows band gap diagrams of diode 26 in an unbiased condition (diagram 60), a forward biased condition (diagram 62) and a reverse biased condition (diagram 64). Diagrams 60 and 64 show that in an unbiased condition, and in a reverse biased condition, bands from dielectric compositions 58, 56, and 54 preclude migration of carriers between conductive materials 22 and 32. In contrast, diagram 62 shows that tunneling may occur in a forward biased condition so that carriers (specifically electrons in the shown embodiment) may tunnel from conductive material 22 to conductive material 32 via quantum wells 66. The flow of the carriers is diagrammatically illustrated with a dashed arrow 63 in FIG. 3. It is noted that the diodes shown in FIGS. 1 and 2 are oriented for current flow from conductive material 32 to conductive material 22. Such is consistent with the diagrams of FIG. 3 which illustrate electron flow from conductive material 22 to conductive material 32 (in other words, in an opposite direction to the current flow). In other embodiments, the arrangement of compositions 54, 56, and 58 may be reversed so that the electron flow in the forward-biased condition is from conductive material 32 to conductive material 22.

The band structures of FIG. 3 may be considered engineered band structures. Heterostructures may be formed by molecular beam epitaxy (MBE) growth of III/V materials. In dielectric materials, a band gap may be engineered through thermal treatments (such as thermal treatment of aluminum oxides), as is known for nonvolatile memory cells (such as "crested barrier" cells and VARIOT flash cells). The band gap engineered structures may exploit characteristics of band-edge discontinuities in carrier transport in the semiconductor, and/or may exploit characteristics of band-edge discontinuities in charge storage of the dielectric. For nonvolatile memory cells, this may enable optimization of retention, and endurance characteristics.

Deposition of thin layers of dielectric material may create local quantum wells 66 which may be exploited in the diode structures described herein. The conduction band and valence band edges of the dielectrics may be engineered by material choice and/or thermal treatments. Fermi-level pinning in the metal region may be engineered by tailoring the compositions of the conductive materials at the tops and bottoms of the diodes. The barrier heights along the dielectric thickness may determine the tunneling characteristics of the structures.

The diodes described in FIGS. 1 and 2 may be considered band-gap engineered in that compositions of materials 22, 32, 54, 56, and 58 are chosen so that the forward-biased tunneling of diagram 62 occurs. In choosing materials 22 and 32, work functions may be considered. A work function may be related to an amount of energy used to remove an electron from a metal. In FIG. 3, heights of the bars corresponding to materials 22 and 32 may represent work functions of materials 22 and 32. As illustrated in FIG. 3, material 22 may have a higher work function (represented by a higher bar) than material 32. Consequently, an amount of energy used to remove an electron from material 22 may be larger than an amount of energy used to remove an electron from material 32. Designing material 22 to have a higher work function than material 32 may help enable electrons to tunnel from material 22 through compositions 54, 56, and 58 to material 32.

In choosing compositions 54, 56, and 58, barrier heights may be considered. A barrier height may be related to an energy difference between a conduction band of a material and a valence band of the material. In FIG. 3, heights of the bars corresponding to compositions 54, 56, and 58 may represent barrier heights of compositions 54, 56, and 58. In some embodiments, barrier heights of compositions 54, 56, and 58 may be greater than work functions of materials 22 and 32 as is illustrated by diagram 60 of FIG. 3.

Band-gap engineering diode 26 may include selecting compositions 54, 56, and 58 so that barrier heights of compositions 54, 56, and 58 have a particular relationship. For example, each of compositions 54, 56, and 58 may have a different barrier height. Further, as illustrated in diagram 60, compositions 54, 56, and 58 may be arranged between materials 22 and 32 in order of increasing barrier height. Accordingly, composition 54 (which is closest to material 22) may have the lowest barrier height of compositions 54, 56, and 58, composition 56 may have a barrier height larger than composition 54, and composition 58 may have a barrier height larger than composition 56.

Compositions 54, 56, and 58 may be chosen to have valence band energy levels that are aligned with respect to one another. By way of example, the valence band energy levels of compositions 54, 56, and 58 may be aligned if the valence band energy levels of compositions 54, 56, and 58 are substantially the same. Alternatively, compositions 54, 56, and 58 may be chosen to have conduction band energy levels that are aligned with respect to one another. By way of example, the conduction band energy levels of compositions 54, 56, and 58 may be aligned if the conduction band energy levels of compositions 54, 56, and 58 are substantially the same.

Compositions 54, 56, and 58 may be selected so that quantum wells 66 are created at the junction between composition 54 and composition 56 and at the junction between composition 56 and 58 when diode 26 is forward biased. As was described above, diode 26 may be forward biased by a voltage applied across materials 32 and 22 so that material 32 is at a higher potential than material 22. Furthermore, in a forward biased condition, quantum wells might form between conductive materials at the tops and bottoms of the diodes (with such conductive materials being the electrodes of the diodes).

The quantum wells will have discrete energy levels. The contact between one electrode and an adjacent dielectric will have a first Fermi level. When energy is provided the state may be raised to a first allowed quantum energy level, which may dramatically increase the probability of carrier tunneling. This may lead to an effective lowering of the potential barrier in the dielectric.

In a reverse bias condition (such as the condition depicted by diagram 64), the potential barrier is high and formation of any quantum well is suppressed. There is, therefore, a low probability for conduction current to flow from one metal to another—due to reduced tunneling, which approaches zero—if the dielectric thickness is appropriately tailored.

Tunneling characteristics across structures such as diode 26 indicate that there may be a sharp turn-on characteristic when the Fermi level corresponds to a lowest allowed quantum energy level. The results may be modified in the presence of phonons at higher temperatures, but a non-linear characteristic may result from such structure.

Tunneling may be a very fast process, and may occur in femtoseconds. Tunneling may also be relatively independent of temperature. Accordingly, thin film diodes of the type described herein may be able to be switched very fast, and to meet high temperature reliability criteria. For example, diode 26 may be forward biased and current may flow through diode 26. Diode 26 may subsequently be reverse biased so that current is inhibited from flowing through diode 26. Diode 26 may be repeatedly forward biased and then reverse biased in this manner at a high rate. In some embodiment, the rate may exceed 10 Ghz.

Some example compositions suitable for the band-gap engineered diodes are aluminum for material 22, aluminum oxide for composition 58, silicon dioxide for composition 56, silicon nitride for composition 54, and tungsten for material 32. Another set of exemplary compositions is molybdenum for material 22, silicon dioxide for composition 58, silicon nitride for composition 56, hafnium oxide for composition 54 and platinum for material 32. Another set of exemplary compositions is platinum for material 22, silicon dioxide for composition 58, hafnium oxide for composition 56, zirconium oxide for composition 54 and nickel for material 32.

FIG. 4 is a schematic circuit diagram illustrating one embodiment of an array of memory cells. Each memory cell includes a diode 26 and a memory element 28 connected in series between a bitline 22 and a wordline 24. Memory element 28 may be configured in one of two or more different resistive states. Consequently, the resistive state of memory element 28 may be used to represent one or more bits of information.

To determine a resistive state of a selected one of the memory cells of FIG. 4, a read voltage may be applied across a selected one of the wordlines 24 and a selected one of the bitlines 22. In response, a current may flow from the selected wordline 24 to the selected bitline 22. This current may be measured to determine a resistive state of the memory element 28 of the selected memory cell. For example, if memory element 28 is configured to be programmed in either a high resistance state or a low resistance state, the current may be measured to determine whether the current corresponds to the high resistance state or the low resistance state.

While the read voltage is being applied across the selected wordline and the selected bitline, voltages may be applied to the other (non-selected) wordlines and bitlines. These voltages may ensure an accurate measurement of the current flowing through the selected cell and may prevent the read voltage and the current flowing through the selected cell from affecting the resistive states of the other (non-selected) memory cells of the array.

For example, voltages may be applied across the non-selected memory cells so that the non-selected bitlines are at an equal or higher potential than the selected wordline, thereby preventing current from flowing through the diodes of the non-selected memory cells sharing the selected wordline.

In some embodiments, the memory cell may be used to store a single bit of information with the low resistance state corresponding to a bit value of "0" and the high resistance state corresponding to a bit value of "1" or vice-versa.

In some embodiments, memory element 28 may be configured in one of four different resistive states. Accordingly, memory element 28 may represent two bits of information. Of course, other embodiments are possible in which memory element 28 has more or fewer than four different resistive states and therefore represents more or fewer than two bits of information.

As will be described below, the resistive state of memory element 28 may be reversibly altered. For example, if memory element 28 is configured to have one of two different resistive states—"A" and "B"—and memory element 28 is currently in resistive state "A," memory element 28 may be altered to be in resistive state "B" and may subsequently be altered again to be in resistive state "A." In some embodiments, the resistive state of memory element 28 may be repeatedly changed without substantially affecting the ability of the memory cell to store one or more bits of information.

Referring to FIG. 5, a fragment of a construction 6 is illustrated. Similar numbering is used in referring to FIG. 5 as is used above in describing FIGS. 1-4 where appropriate. Fragment 6 is one embodiment of a construction of one of the memory cells of FIG. 4. Fragment 6 comprises a base 12 (described above) and a memory cell 10 over base 12.

A schematic electrical diagram 8 is shown adjacent fragment 6 to illustrate some of the electrical components of fragment 6. Electrical diagram 8 shows that memory cell 10 comprises a wordline 24, a memory element 28, a diode 26, and a bitline 22.

Wordline 24 and bitline 22 are shown in construction 6 to comprise electrically conductive material. Such electrically conductive material may comprise any suitable composition or combination of compositions, including one or more of various metals (for instance, tantalum, platinum, tungsten, aluminum, copper, gold, etc.), metal-containing compositions (for instance, metal nitrides, metal silicides, etc.), and conductively-doped semiconductor materials (for instance, conductively-doped silicon). The individual wordlines and bitlines may have thicknesses of from about 2 nanometers to about 20 nanometers.

Wordline 24, memory element 28, and conductive material 32 together form memory component 52. Memory element 28 may comprise any suitable composition or combination of compositions, and may, for example, comprise, consist essentially of, or consist of one or more magnetoresistive materials susceptible to undergoing a reduction-oxidation (redox) process. In some embodiments memory element 28 may comprise one or more metal oxides that exhibit two different stable stoichiometric states.

For example, memory element 28 may comprise iron oxide and may be configured in one of two different resistive states. In a first one of the two resistive states, memory element 28 may comprise primarily $Fe_3O_4$ and may comprise more $Fe_3O_4$ than $Fe_2O_3$. In this resistive state, memory element 28 may have a relatively low resistance of about 5e3 Ohms.

In a second one of the two resistive states, memory element 28 may comprise primarily $Fe_2O_3$ and may comprise more $Fe_2O_3$ than $Fe_3O_4$. Accordingly, in the first resistive state, memory element 28 may have a higher concentration of oxygen than in the second resistive state. In the second resistive state, memory element 28 may have a relatively high resistance of about 1e5 Ohms.

When in the first resistive state, memory element 28 may be reconfigured in the second resistive state instead of the first resistive state. In some embodiments, a programming voltage may be applied across wordline 24 and bitline 22. The voltage may be up to 15 volts. In response to the programming voltage, a programming current may travel through memory element 28. The current may be sufficient to cause a redox reaction in memory element 28 thereby reconfiguring memory element in the second resistive state instead of the first resistive state. In some embodiments the programming current may be in the form of a current pulse having a duration of less than 1 millisecond.

Memory element 28 may remain in the second resistive state after the programming current and/or the programming voltage have been discontinued. In some embodiments, memory element 28 may be doped with a quantity of metallic atoms e.g., up to 1e15 atoms per $cm^3$. The metallic atoms may increase an amount of time a magnetoresistive material of memory element 28 retains a particular resistive state as compared to an amount of time the memory cell would retain the particular resistive state if memory element 28 was undoped by preventing a redox reaction that would alter the resistive state of memory element 28 from taking place. In some embodiments, the metallic ions may be copper ions and/or zinc ions.

Once memory element 28 has been reconfigured in the second resistive state, memory element 28 may be reconfigured in the first resistive state. In some embodiments, a programming voltage may be applied across bitline 22 and wordline 24 so that bitline 22 is at a higher potential than wordline 24. As a result of the voltage, an electric field may exist across memory element 28. The electric field may be of sufficient intensity to cause a redox reaction in memory element 28 so that memory element 28 is reconfigured in the first resistive state. In some embodiments, the programming voltage may be up to 15 volts and may be between 10 volts and 15 volts. In some embodiments, little or no current may flow through memory element 28 as a result of the voltage because diode 26 may be reverse biased and may inhibit a current from flowing from bitline 22 to wordline 24.

In some embodiments, one or more conductive bridges may be formed through memory element 28 as a result of the redox reaction caused by the programming current. The one or more conductive bridges may be severed by a programming voltage applied across bitline 22 and wordline 24 so that bitline 22 is at a higher potential than wordline 24. In some embodiments, a plurality of slightly different voltage levels may respectively sever the multiple conductive bridges.

Alternatively, in some embodiments, the one or more conductive bridges may be severed by a programming current flowing from material 32 through material 40 into material 38.

Conductive material 32, insulative material 34 (comprising dielectric compositions 54, 56, and 58 as was described above in relation to FIG. 2), and bitline 22 together form diode 26 as was described in detail above in relation to FIGS. 1-3. Conductive material 32 is overlapped by memory component 35 and diode 26. In some embodiments, conductive material 32 may be referred to as conductive diode material (or in other words, as a diode electrode), even though material 32 is also part of memory component 52.

As was described above in relation to FIG. 3, diode 26 may be configured so as to enable electrons to tunnel through insulative material 34. Due to this tunneling, electrons exiting diode 26 via material 32 and entering memory element 28 may have a very high energy level. For example, the electrons may have an energy level that is between 2.0 and 3.0 electron volts higher than an energy level that the electrons would have if diode 26 was a convention p-n diode. In some embodiments, the electrons may have an energy level of at least 3.5 to 4.0 electron volts. Due to the high energy level, the electrons may be predominantly ballistic. Ballistic electrons may more efficiently cause the redox reaction in memory element 28 than non-ballistic electrons. For example, a programming voltage used to program memory cell 10 may be lower than a program a memory cell having a conventional p-n diode since diode 26 of memory cell 10 provides ballistic electrons having a higher energy level than non-ballistic electrons provided by conventional p-n diodes.

In schematic electrical diagram 8, diode 26 is shown between bitline 22 and memory element 28. In other embodiments, diode 26 may be additionally, or alternatively, provided between wordline 24 and memory element 28.

In the shown embodiment, diode 26 permits current flow from memory component 52 to bitline 22, but restricts current flow in the opposing direction. Such can enable reading to and writing from individual memory elements, while limiting cross-talk between adjacent memory elements.

Although diode 26 is shown oriented to direct current flow from memory component 52 to bitline 22, in other embodiments the orientation of diode 26 may be reversed. Accordingly, diode 26 may be oriented to permit current flow from bitline 22 to memory component 52, and to restrict current flow in the opposing direction.

In some embodiments, memory cell 10 may be incorporated into an array comprising vertical stacking of memory cells and/or horizontal arrangement of memory cells. In some embodiments, wordline 24 may be part of a plurality of memory cells (e.g., a column of memory cells as illustrated in FIG. 4) in addition to memory cell 10 and may extend substantially orthogonally to bitline 22. Bitline 22 may be part of plurality of memory cells (e.g., a row of memory cells as illustrated in FIG. 4) in addition to memory cell 10. The term "substantially orthogonally" means that the bitlines and wordlines are more orthogonal to one another than not, which can include, but is not limited to, embodiments in which the wordlines and bitlines are entirely exactly orthogonal to one another.

The embodiment of FIGS. 4 and 5 may be fabricated as follows. Initially, bitlines 22 may be formed over semiconductor base (or substrate) 12. Bitlines 22 may be patterned utilizing photolithographic processing and one or more etches to pattern bitline material into a plurality of lines.

Subsequently, a first level of diode dielectric material 34 (which may be a stack of multiple dielectric compositions, e.g., as discussed above in relation to FIGS. 1-3) is formed over the bitlines. Diode dielectric material 34 may be deposited across the bitlines and spaces between the bitlines, and then patterned utilizing photolithographic processing and one or more etches to create the configuration shown in FIG. 5. In some embodiments, diode dielectric material 34 is only at cross-points of the wordlines and bitlines. In some embodiments, the diode dielectric material may be left between the bitlines rather than patterned to be only at cross-points of the wordlines and bitlines. Diode dielectric material 34 may be deposited with any suitable methodology, including, for example, ALD.

A first level of electrically conductive diode material (i.e., a diode electrode) 32 is then formed over diode dielectric material 34. Electrically conductive material 32 may be formed in the configuration shown in FIG. 5 by depositing the material and then patterning it with a photolithographically patterned mask and one or more etches.

Memory elements 28 are then formed over electrically conductive material 32. The memory elements may be formed by depositing memory element material across the bitlines and spaces between the bitlines, and then patterning the memory element material utilizing photolithographic processing and one or more etches to create the shown configuration in which the memory element material is only at cross-points of the wordlines and bitlines. In some embodiments, the memory element material may be left between the bitlines rather than patterned to be only at cross-points of the wordlines and bitlines.

A first level of wordline material is formed over the memory elements. The wordline material may be deposited across the bitlines and spaces between the bitlines, and then patterned utilizing photolithographic processing and one or more etches to create the shown configuration in which the bitlines are substantially orthogonal to the wordlines.

Subsequent levels of bitlines, diode dielectric, conductive diode material, memory elements, and wordlines may be formed using subsequent iterations of the above-discussed processing, separated by a passivation material, to form vertically-stacked memory arrays to desired heights. In some embodiments, the vertical stacks may comprise at least 3 memory cells, at least 10 memory cells, or at least 15 memory cells.

The vertically-stacked memory cells may be identical to one another, or may differ from one another. For instance, the diode material utilized for memory cells at one level of a vertical stack may be different in composition from the diode material utilized for memory cells at another level of a vertical stack; or may be the same composition as the diode material utilized for the memory cells at the other level of the vertical stack.

FIG. 5 illustrates diode 26 provided between the bitline 22 and memory component 52. In other configurations, including configurations in which memory cells are stacked as discussed above, diode 26 may be provided between memory component 52 and wordline 24. The fabrication process utilized to form such other configurations may be similar to that utilized to form the configuration of FIG. 5, except that the conductive diode material and diode dielectric material may be formed after formation of the memory elements rather than before formation of the memory elements. In yet other embodiments, the orientation of the wordlines and bitlines in the memory cells may be reversed (so that the wordlines are under the bitlines) and the diodes may be formed either between the wordlines and the memory elements, or between the bitlines and the memory elements.

Other configurations of memory element 28 are also possible.

Figure 6:
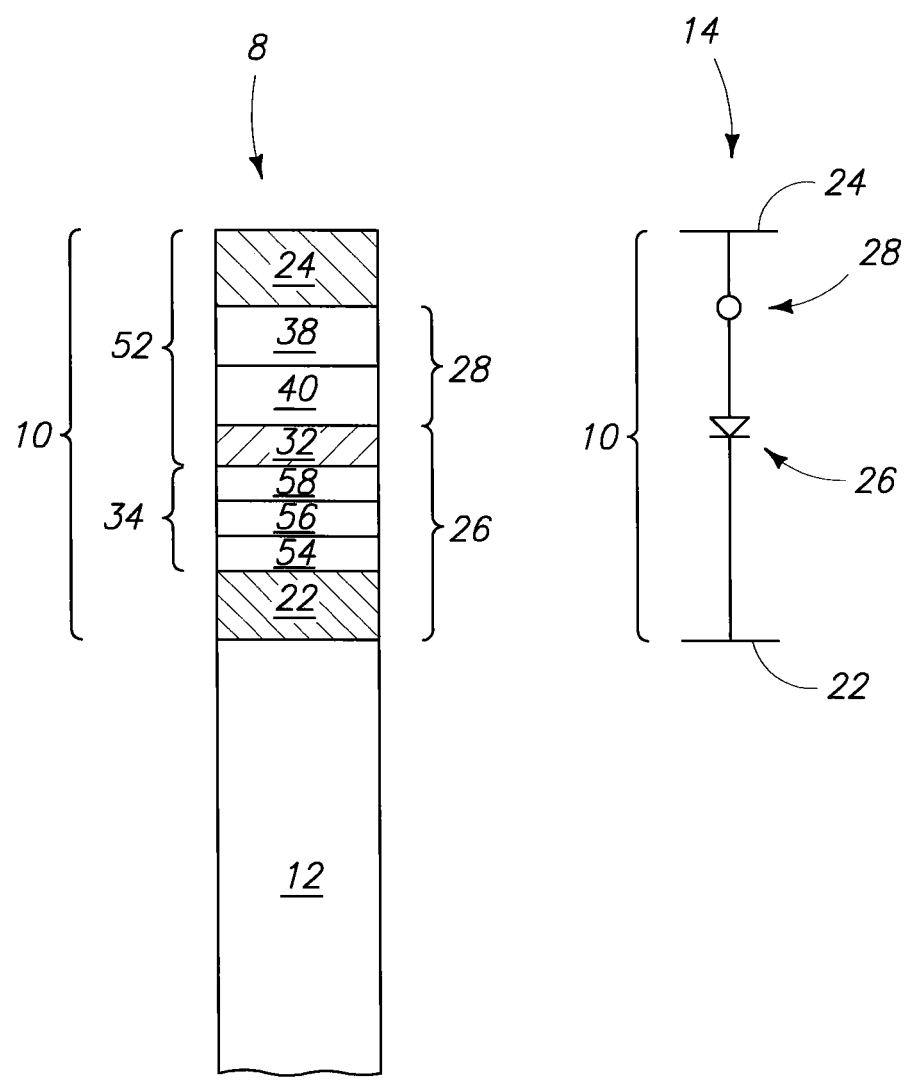
FIG. 6 is diagrammatic cross-sectional view of a portion of a semiconductor construction in accordance with an embodiment.

Referring to FIG. 6, a fragment of a construction 8 is illustrated. Similar numbering is used in referring to FIG. 6 as is used above in describing FIGS. 1-5 where appropriate. FIG. 6 illustrates an alternative embodiment of memory element 28. Fragment 8 is one embodiment of a construction of one of the memory cells of FIG. 4. Fragment 8 comprises a base 12 (described above) and a memory cell 10 over base 12.

A schematic electrical diagram 14 is shown adjacent fragment 8 to illustrate some of the electrical components of fragment 8. Electrical diagram 14 shows that memory cell 10 comprises wordline 24, diode 26, and bitline 22, each of which are described in detail above.

Memory cell 10 also comprises memory element 28, which in the embodiment depicted in FIG. 6 includes material 38 and material 40. Material 38 may comprise, consist essentially of, or consist of an ion-rich conductive material such as ionic copper or ionic silver. In some embodiments, material 38 may be embedded and activated by a reactive ion such as tellurium or selenium. Accordingly, material 38, in some embodiments, may comprise one or more of Cu—Te, Cu—Se, Ag—Te, or Ag—Se, which are referred to in terms of the principal components, rather than in terms of specific stoichiometries.

In some embodiments, material 38 may comprise, consist essentially of, or consist of a doped chalcogenides and the doped chalcogenides may be a glass. For example, material 38 may comprise one or more of germanium, selenium, tellurium, or silver. Material 38 may be doped with germanium, selenium, tellurium, or silver at a concentration of 1.0e16 to 5.0e17 atoms per $cm^3$.

Material 40 may be a thin oxide material such as a metal oxide. In some embodiments, material 40 may have a thickness of less than 25 Angstroms. Material 40 may be in direct physical contact with material 38 and material 32. Accordingly, material 40 may impose a separation between material 38 and material 32 of less than 25 Angstroms.

Memory element 28 may be configured in one of two or more different resistive states. In some embodiments, memory element 28 may be configured in one of two different resistive states. In a first one of the two resistive states, memory element 28 may have a relatively high resistance (e.g., between around 1 mega ohm and 100 mega ohms). In a second one of the two resistive states, memory element 28 may have a relatively low resistance (e.g., between around 6.5 k ohms and 10 k ohms).

When in the first resistive state, memory element 28 may be reconfigured in the second resistive state instead of the first resistive state. In some embodiments, a programming voltage may be applied across wordline 24 and bitline 22. The voltage may be up to 15 volts. In response to the programming voltage, a programming current may travel through memory element 28. The current may cause ions from material 38 to be swept from material 38 into material 40 due to momentum transfer between the ions and electrons of the current. In some embodiments, the movement of ions from material 38 into material 40 may be referred to as electromigration. The ions may form a conductive bridge between material 38 and material 32 that may reduce the resistance of memory element 28, thereby reconfiguring memory element 28 in the second one of the two resistive states. In some embodiments the programming current may be in the form of a current pulse having a duration of as long as several milliseconds or as short as several microseconds.

Memory element 28 may remain in the second resistive state after the programming current and/or the programming voltage have been discontinued.

Once memory element 28 has been reconfigured in the second resistive state, memory element 28 may be reconfigured in the first resistive state. In some embodiments, a programming voltage may be applied across bitline 22 and wordline 24 so that bitline 22 is at a higher potential than wordline 24. As a result of the voltage, an electric field may exist across memory element 28. The electric field may be of sufficient intensity to sever the conductive bridge formed by the migrated ions so that memory element 28 is reconfigured in the first resistive state. In some embodiments, the programming voltage may be up to 15 volts. In some embodiments, little or no current will flow through memory element 28 as a result of the voltage because diode 26 may be reverse biased and may inhibit a current from flowing from bitline 22 to wordline 24.

In some embodiments, multiple conductive bridges may be present and each of the multiple conductive bridges may be severed at a slightly different voltage level. Alternatively, in some embodiments, the conductive bridge may be severed by a programming current flowing from material 32 through material 40 into material 38.

As was described above in relation to FIG. 3, diode 26 may be configured so as to enable electrons to tunnel through insulative material 34. Due to this tunneling, electrons exiting diode 26 via material 32 and entering material 40 may have a very high energy level and may be ballistic as was described above in relation to FIG. 5. Ballistic electrons may more efficiently cause the migration of ions from material 38 into material 40 than non-ballistic electrons. For example, a programming voltage used to program memory cell 10 may be lower than a program a memory cell having a conventional p-n diode since diode 26 of memory cell 10 provides ballistic electrons having a higher energy level than non-ballistic electrons provided by conventional p-n diodes.

In schematic electrical diagram 14, diode 26 is shown between bitline 22 and memory element 28. In other embodiments, diode 26 may be additionally, or alternatively, provided between wordline 24 and memory element 28.

The embodiment of FIG. 6 may be fabricated as follows. Initially, bitlines 22 may be formed over semiconductor base (or substrate) 12. Bitlines 22 may be patterned utilizing photolithographic processing and one or more etches to pattern bitline material into a plurality of lines.

Subsequently, a first level of diode dielectric material 34 (which may be a stack of multiple dielectric compositions, e.g., as discussed above in relation to FIGS. 1-3) is formed over the bitlines. Diode dielectric material 34 may be deposited across the bitlines and spaces between the bitlines, and then patterned utilizing photolithographic processing and one or more etches to create the configuration shown in FIG. 5. In some embodiments, diode dielectric material 34 is only at cross-points of the wordlines and bitlines. In some embodiments, the diode dielectric material may be left between the bitlines rather than patterned to be only at cross-points of the wordlines and bitlines. Diode dielectric material 34 may be deposited with any suitable methodology, including, for example, ALD.

A first level of electrically conductive diode material (i.e., a diode electrode) 32 is then formed over diode dielectric material 34. Electrically conductive material 32 may be formed in the configuration shown in FIG. 5 by depositing the material and then patterning it with a photolithographically patterned mask and one or more etches.

Memory elements 28 are then formed over electrically conductive material 32. The memory elements may be formed by first depositing material 40 over material 32 and then depositing material 38 over material 40. Materials 38 and 40 may be patterned utilizing photolithographic processing and one or more etches to create the shown configuration in which memory element 28 is only at cross-points of the wordlines and bitlines. In some embodiments, materials 38 and 40 may be left between the bitlines rather than patterned to be only at cross-points of the wordlines and bitlines.

A first level of wordline material is formed over the memory elements. The wordline material may be deposited across the bitlines and spaces between the bitlines, and then patterned utilizing photolithographic processing and one or more etches to create the shown configuration in which the bitlines are substantially orthogonal to the wordlines.

Subsequent levels of bitlines, diode dielectric, conductive diode material, memory elements, and wordlines may be formed using subsequent iterations of the above-discussed processing, separated by a passivation material, to form vertically-stacked memory arrays to desired heights. In some embodiments, the vertical stacks may comprise at least 3 memory cells, at least 10 memory cells, or at least 15 memory cells.

The vertically-stacked memory cells may be identical to one another, or may differ from one another. For instance, the diode material utilized for memory cells at one level of a vertical stack may be different in composition from the diode material utilized for memory cells at another level of a vertical stack; or may be the same composition as the diode material utilized for the memory cells at the other level of the vertical stack.

FIG. 6 illustrates diode 26 provided between the bitline 22 and memory component 52. In other configurations, including configurations in which memory cells are stacked as discussed above, diode 26 may be provided between memory component 52 and wordline 24. The fabrication process utilized to form such other configurations may be similar to that utilized to form the configuration of FIG. 6, except that the conductive diode material and diode dielectric material may be formed after formation of the memory elements rather than before formation of the memory elements. In yet other embodiments, the orientation of the wordlines and bitlines in the memory cells may be reversed (so that the wordlines are under the bitlines) and the diodes may be formed either between the wordlines and the memory elements, or between the bitlines and the memory elements.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
   a memory component comprising:
      a first conductive material;
      a second conductive material;
      an oxide material between the first conductive material and the second conductive material; and
      wherein the memory component is configured to have different electrical resistances corresponding to different memory states of the memory cell as a result of conduction of a current from the first conductive material through the oxide material to the second conductive material; and
   a diode comprising a first electrode, a second electrode, and a dielectric material, the diode being connected in series with the memory component so that a current passing through the diode also passes through the memory component.

2. The memory cell of claim 1 wherein the first electrode comprises a first metal and the second electrode comprises a second metal different than the first metal.

3. The memory cell of claim 2 wherein a first work function associated with the first metal is related to an amount of energy used to remove an electron from the first metal and a second work function associated with the second metal is related to an amount of energy used to remove an electron from the second metal, the first work function being lower than the second work function.

4. The memory cell of claim 2 wherein the dielectric material has a barrier height greater than both a work function of the first metal and a work function of the second metal, the barrier height being related to an energy difference between a conduction band of the dielectric material and a valence band of the dielectric material.

5. The memory cell of claim 2 wherein the first metal is one of aluminum, tungsten, molybdenum, platinum, nickel, tantalum, copper, titanium, tungsten silicide, or tantalum silicide and the second metal is a different one of aluminum, tungsten, molybdenum, platinum, nickel, tantalum, copper, titanium, tungsten silicide, or tantalum silicide.

6. The memory cell of claim 1 wherein the diode is configured to conduct electrons that are predominantly ballistic and have an energy of at least 3.0 electronvolts.

7. The memory cell of claim 1 wherein the dielectric material comprises at least one material selected from among silicon dioxide, silicon nitride, titanium oxide, tantalum oxide, aluminum oxide, aluminum nitride, hafnium oxide, zirconium oxide, magnesium oxide, yittrium oxide, and niobium oxide.

8. The memory cell of claim 1 wherein the dielectric material comprises a plurality of layers, individual layers of the plurality of layers having different dielectric compositions relative to one another; and wherein the dielectric material is configured to form quantum wells at junctions between the layers of the plurality as a result of a voltage being applied across the first electrode and the second electrode.

9. The memory cell of claim 8:
wherein individual layers of the plurality of layers have different barrier heights relative to one another, the barrier heights being related to energy differences between conduction bands and valence bands of the layers of the plurality; and
wherein the plurality of layers are physically arranged between the second electrode and the first electrode in order of increasing barrier height, a layer of the plurality nearest the second electrode having the lowest barrier height of the plurality and a layer of the plurality nearest the first electrode having the highest barrier height of the plurality.

10. A memory cell comprising:
a memory component comprising:
a first conductive material;
a second conductive material;
an oxide material between the first conductive material and the second conductive material; and
wherein the memory component is configured to have different electrical resistances corresponding to different memory states of the memory cell as a result of conduction of a current from the first conductive material through the oxide material to the second conductive material; and
wherein the first conductive material is separated from the second conductive material by the oxide material and the oxide material is in direct physical contact with the first conductive material and the second conductive material.

11. The memory cell of claim 10 wherein the first conductive material and the second conductive material are separated by a distance of less than 25 Angstroms.

12. A memory cell comprising:
a memory component comprising:
a first conductive material comprising ionic copper or ionic silver;
a second conductive material;
an oxide material between the first conductive material and the second conductive material; and
wherein the memory component is configured to have different electrical resistances corresponding to different memory states of the memory cell as a result of conduction of a current from the first conductive material through the oxide material to the second conductive material.

13. A memory cell comprising:
a memory component comprising:
a first conductive material comprising Cu—Te, Cu—Se, Ag—Te, or Ag—Se;
a second conductive material;
an oxide material between the first conductive material and the second conductive material; and
wherein the memory component is configured to have different electrical resistances corresponding to different memory states of the memory cell as a result of conduction of a current from the first conductive material through the oxide material to the second conductive material.

14. A method of programming a memory cell, the memory cell comprising a memory component comprising a first conductive material comprising a metal, a second conductive material, and an oxide material between the first conductive material and the second conductive material, the method comprising:
providing the memory component in a first resistive state having a first electrical resistance at a first moment in time; and
at a second moment time after the first moment in time, conducting a current from the first conductive material through the oxide material to the second conductive material, the current being sufficient to cause electromigration of the metal from the first conductive material into the oxide material and to provide the memory component in a second resistive state having a second electrical resistance different than the first electrical resistance.

15. A method of programming a memory cell, the memory cell comprising a memory element comprising a magnetoresistive material and a diode comprising metal and a dielectric material, the diode and the memory element being connected together in series, the method comprising:
providing the memory element in a first resistive state having a first electrical resistance at a first moment in time; and
at a second moment time after the first moment in time, conducting a current through the memory element and the diode effective to reconfigure the memory element to be in a second resistive state different than the first resistive state and having a second electrical resistance different than the first electrical resistance.

16. The method of claim 15 wherein the magnetoresistive material undergoes a reduction-oxidation process as a result of the conducting of the current.

17. The method of claim 15 wherein while in the first resistive state, the magnetoresistive material comprises a higher concentration of oxygen than while in the second resistive state.

18. The method of claim 15:
wherein while in the first resistive state, the memory cell comprises more $Fe_3O_4$ than $Fe_2O_3$; and
wherein when in the second resistive state the memory cell comprises more $Fe_2O_3$ than $Fe_3O_4$.

19. The method of claim 15 wherein the current is in the form of a current pulse.

20. The method of claim 15 further comprising ceasing the conducting of the current after the memory element has been reconfigured in the second resistive state and wherein the memory element remains in the second resistive state in the absence of the current.

21. The method of claim 15 further comprising subsequent to the conducting of the current, applying a voltage across the memory device effective to reconfigure the memory cell back to the first resistive state.

* * * * *

UNITED STATES PATENT AND TRADEMARK OFFICE
CERTIFICATE OF CORRECTION

PATENT NO. : 8,871,574 B2  Page 1 of 1
APPLICATION NO. : 13/959511
DATED : October 28, 2014
INVENTOR(S) : Chandra Mouli It is certified that error appears in the above-identified patent and that said Letters Patent is hereby corrected as shown below:

In The Claims

In column 14, line 62, in Claim 7, delete "yittrium" and insert -- yttrium --, therefor.

Signed and Sealed this
Thirtieth Day of December, 2014

Michelle K. Lee
*Deputy Director of the United States Patent and Trademark Office*